(12) United States Patent
Chang

(10) Patent No.: US 6,518,125 B1
(45) Date of Patent: Feb. 11, 2003

(54) METHOD FOR FORMING FLASH MEMORY WITH HIGH COUPLING RATIO

(75) Inventor: Ching-Yu Chang, I-Lan (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/714,200

(22) Filed: Nov. 17, 2000

(51) Int. Cl.[7] .................. H01L 21/336; H01L 21/3205
(52) U.S. Cl. ................ 438/259; 438/258; 438/266; 438/585; 438/592; 438/586
(58) Field of Search .................. 438/257, 258, 438/259, 592, 585, 586

(56) References Cited

U.S. PATENT DOCUMENTS

| | | | | |
|---|---|---|---|---|
| 5,541,130 A | * | 7/1996 | Ogura et al. | 438/257 |
| 5,587,332 A | * | 12/1996 | Chang et al. | 438/258 |
| 5,879,978 A | * | 3/1999 | Ra | 438/197 |
| 5,879,990 A | * | 3/1999 | Dormans et al. | 438/257 |
| 6,002,151 A | * | 12/1999 | Liu et al. | 257/316 |
| 6,165,844 A | * | 12/2000 | Chang | 438/260 |
| 6,331,465 B1 | * | 12/2001 | Forbes et al. | 438/260 |
| 6,342,715 B1 | * | 1/2002 | Shimizu et al. | 257/314 |
| 6,424,011 B1 | * | 7/2002 | Assaderaghi et al. | 257/350 |

FOREIGN PATENT DOCUMENTS

| | | | |
|---|---|---|---|
| JP | 405013594 A | * | 1/1993 |
| JP | 405167065 A | * | 7/1993 |
| JP | 405167067 A | * | 7/1993 |
| JP | 406224161 A | * | 8/1994 |

OTHER PUBLICATIONS

S. Wolf et al., Silicon Processing For The VLSI ERA, 1986, Lattice Press, vol. 1, pp. 529–534).*

* cited by examiner

Primary Examiner—Caridad Everhart
Assistant Examiner—Chuong Anh Luu

(57) ABSTRACT

First of all, a semiconductor substrate has the poly regions thereon. Then the souse/drain regions are formed in the semiconductor substrate by performing the ion-implant method. Next, the dielectric layers are formed on the souse/drain regions and between the poly regions. For increasing the coupling ratio of the flash memory, the photoresist layers, individually, are defined on the dielectric layers and the poly regions. Afterward, the dielectric layers are etched by performing an etched process and the photoresist layers as etched masks, wherein the dielectric layers have the swing-like surfaces with large surface area after the etched process is finished. The photoresist layers are then removed. A polysilicon layer is formed along swing-like surfaces of dielectric layers and the surfaces of the poly regions by conforming method, while the polysilicon layer is patterned to form the first gates. Then an ONO layer is formed along the surfaces of the first poly gates by conforming method. Finally, a polysilicon layer, again, is formed along the surfaces of dielectric layers and the surface of the ONO layer by conforming method, so as to be a second gate.

20 Claims, 8 Drawing Sheets

METHOD FOR FORMING FLASH MEMORY WITH HIGH COUPLING RATIO

BACKGROUND OF THE INVENTION

1. Field of the Invention

The present invention relates generally to a method for forming a semiconductor devices process, and more particularly to a method for a capacitor having swing-like structure.

2. Description of the Prior Art

Recent, developments have included various techniques for increasing the density of integration of the semiconductor memory device and decreasing the voltage thereof. A control gate and a floating gate have long been utilized for forming a flash memory. Electrons are moved onto or removed from the floating gate of a given memory cell in order to program or erase its state. The floating gate is surrounded by an electrically insulated dielectric. Since the floating gate is well insulated, this type of memory device is not volatile; that is, the floating gate retains its charge for an indefinite period without any power being applied to the device. Moreover, if enough electrons are so injected into the floating gate, the conductivity of the channel of the field effect transistor of which the floating gate is a part is changed. Hence, a control gate is coupled with the floating gate through a dielectric layer and acts as a word line to enable reading or writing of a single selected cell in a two-dimensional array of cells.

One type of memory array integrated circuit chip includes elongated, spaced apart source and drain regions formed in a surface of a semiconductor substrate, wherein the source and drain regions form the bit lines of the memory. A two-dimensional array of floating gates has each floating gate positioned in a channel region between adjacent source and drain regions, while the control gate is positioned over each row of floating gates in a direction transverse to the source and drain regions, wherein the control gates are the word lines of the memory array.

The coupling ratio proceeds from writing and reading in the flash memory via electrons that are transmitted between floating gate and source/drain, wherein the coupling ratio is a rate that show real voltage transmitted from external voltage into the floating gate. Hence, the used voltage is as high as the coupling ratio, that is, the lose voltage is becoming more and more lower. On the other hand, if the coupling ratio is high, the requirements of operating voltage for programming or erasing will be lower, that is, the memory efficiency is great, and results in the flash memory can erase rapidly and efficiently. As shown in FIG. 1A, a conventional flash memory 100 has a floating gate 110 and a control gate 120. Electrons flow through tunnel oxide layer 140 from drain 130 into floating gate 110 by tunnel effect or hot-channel, so as to arise threshold voltage of the flash memory 100 and to save data. Furthermore, electrons flow through tunnel oxide layer 140 from floating gate 110 into source 150 by tunnel effect or hot-channel, so as to decrease threshold voltage of the flash memory 100 and to erase data.

The circuit equivalent of flash memory 100 of above is shown in FIG. 1B, wherein the capacitance between floating gate 110 and control gate 120 is $C_1$; the capacitance between floating gate 110 and source 150 is $C_2$; the capacitance between floating gate 110 and channel 160 is $C_3$ and the capacitance between floating gate 110 and drain 130 is $C_4$. Hence, the coupling ratio of the flash memory is defined that $CR=C_1/(C_1+C_2+C_3+C_4)$. Accordingly, capacitance C1 between the floating gate 110 and control gate 120 has to be increased or C2, C3 and C4 to be decreased for raising the coupling ratio CR. The coupling ratio(CR) is also increased by increasing area of the dielectric layer between the floating gate 110 and control gate 120 or by decreasing tunnel region, due to the ratio of capacitance to surface area of dielectric layer or coupling area is direct proportion, and that the ratio of capacitance to distance is inverse proportion. However, coupling area is becoming more and more small when the dimension of device is shrink gradually, so that coupling ratio is decreased. Moreover, to be suitable for using low voltage, conventional process can only use the method for changing surface area to solve issue of coupling ratio.

A method for forming flash memory with the triple-poly according to the prior art is illustrated in FIGS. 2A to 2C, wherein FIG. 2A is a plan view of flash memory array formed by FIG. 2B and FIG. 2C, but shows only its major components for ease of understanding. First of all, a semiconductor substrate 200 has a tunnel oxide layer 212 thereon and poly regions 210 are located on the tunnel oxide layer 212. Then, the souse/drain regions 220 are formed in the semiconductor substrate 200 by ion-implant. Next, the dielectric layers 230 are formed between the poly regions 210. For increasing the coupling ratio of the flash memory, the poly regions 210 have crown surfaces 240, so as to increase surfaces area of the gates. Dielectric layers are then formed along crown surfaces 240 of poly gates 210 by conforming method, wherein the batter material of the dielectric layer 250 is oxide-nitride-oxide layer (ONO). Afterward a polysilicon layer 260 is formed on the structure of above, as shown in FIG. 2D. FIG. 2D is a plan view of flash memory array finished, but shows only its major components for ease of understanding, and the cross-sectional views of FIG. 2C takes along line III–III' in FIG. 2D.

Furthermore, conventional method for increasing the coupling ratio introduces to increase the surface area of gate. The common method for increasing the effective surface area of gate is used to arise three-dimensional structure. As shown in FIG. 2B, the crown surfaces 240 of the poly regions 210 have a height difference ΔH. If the height difference ΔH of the vertical structure of the sidewall is overhigh, it will make issue, which in the follow-up etched process of flash memory, that is, the semiconductor substrate will be damaged by means of overetching the dielectric layer or the oxide-nitride-oxide layer (ONO), so that the process window is difficult to control.

As shown in FIGS. 2E to 2G, and the cross-sectional views of FIG. 2E to 2G take along line II–II' in FIG. 2D. For finishing the circuit of flash memory, some regions have to proceed with follow-up etching process, such as the part of line II–II' in FIG. 2D, so as to remove the poly regions 210 and the dielectric layers 250 within line II–II' in FIG. 2D, as shown in FIG. 2E. Although the selectivity between the poly region and the dielectric layer is good, the selectivity between the dielectric layer and the oxide-nitride-oxide layer (ONO) is bad. Hence, the dielectric layers 230 will be removed during the oxide-nitride-oxide layers(ONO)are etched, and it will damage source/drain regions 220 during the poly regions 210 are etched.

In accordance with the above description, a new and improved method for increasing coupling ratio of flash memory is therefore necessary, so as to raise the yield and quality of the follow-up process.

SUMMARY OF THE INVENTION

In accordance with the present invention, a method is provided for fabricating the flash memory having high coupling ratio that substantially overcomes drawbacks of above mentioned problems arised from the conventional methods.

Accordingly, it is a main object of the present invention to provide a method for fabricating the flash memory having high coupling ratio. This invention can form the gate with large surface area, so as to increase the coupling ratio of flash memory. Hence, the present invention is appropriate for deep sub-micron technology to provide the semiconductor devices.

Another object of the present invention is to provide a method for forming the gate of flash memory. The present invention can increase the surface area of the gate by changing the surface profile of the substrate, wherein the surface shape is a swing-like shape. Furthermore, the swing-like surface shape can avoid forming vertical structure of the sidewall to control the process window and damaging the source/drain region during the follow-up etched process.

Still another object of the present invention is to provide a method for forming the gate having large surface area. The present invention can increase the surface area of the gate by etching method that is performed before forming the dielectric layer. Hence, the present invention can correspond to economic effect.

In accordance with the present invention, a new method for forming semiconductor devices is disclosed. First of all, a semiconductor substrate has a tunnel oxide layer thereon and a poly region is located on the tunnel oxide layer. Then the souse/drain regions are formed in the semiconductor substrate by performing the ion-implant method. Next, the dielectric layers are formed on the souse/drain regions and between the poly regions. For increasing the coupling ratio of the flash memory, the photoresist layers, individually, are defined on the dielectric layers and the poly regions. Afterward, the dielectric layers are etched by performing an etched process and the photoresist layers as etched masks, wherein the dielectric layers have the swing-like surfaces with large surface area after the etched process is finished. The photoresist layers are then removed. A polysilicon layer is formed along swing-like surfaces of dielectric layers and the surfaces of the poly regions by conforming method, while the polysilicon layer is patterned to form the first gates. Then an ONO layer is formed along the surfaces of the first poly gates by conforming method. Finally, a polysilicon layer, again, is formed along the surfaces of dielectric layers and the surface of the ONO layer by conforming method, so as to be a second gate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 3A:
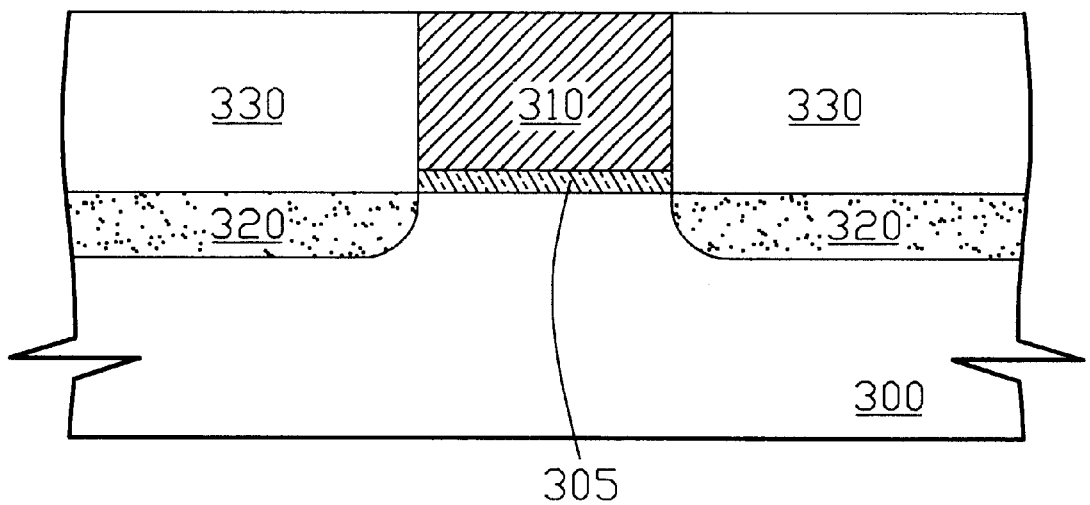
FIGS. 3A to 3F show cross-sectional views illustrative of various stages in the fabrication of flash memory with high coupling ratio in accordance with one embodiment of the present invention.
Figure 3B:
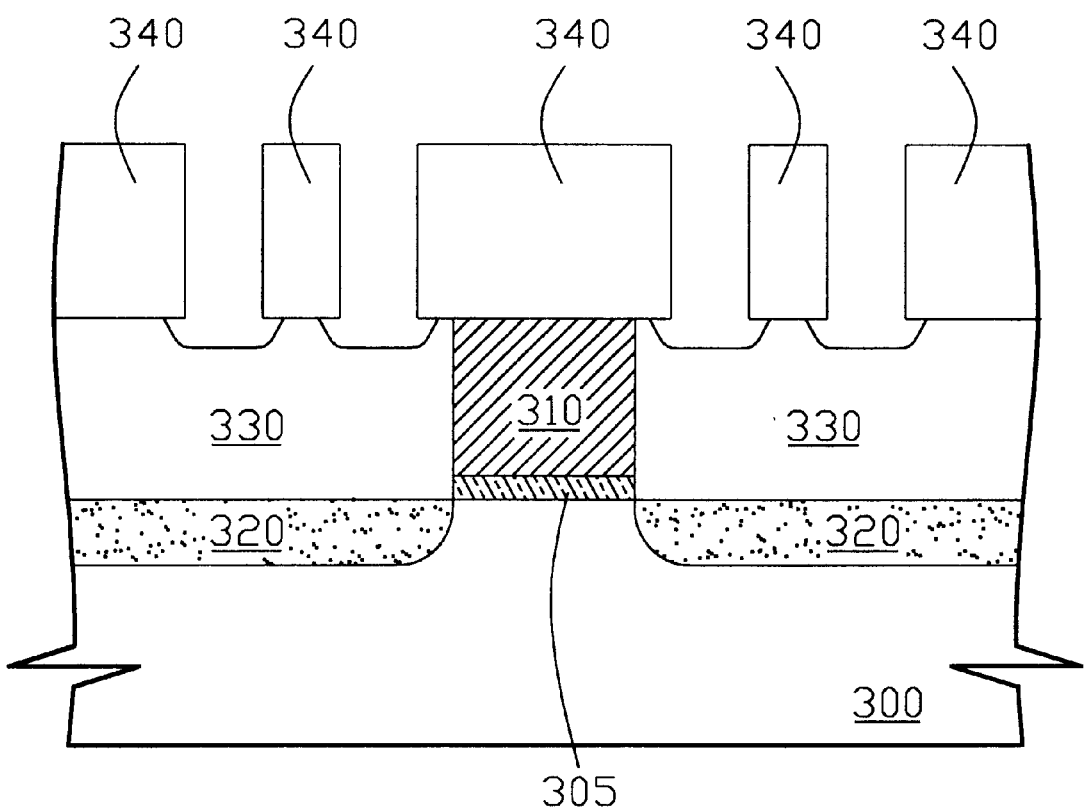

As illustrated in FIG. 3A, in this embodiment, first of all, a semiconductor substrate 300 has a tunnel oxide layer 305 thereon and the first poly region 310 is located on the tunnel oxide layer 305. Then a souse/drain region 320 is formed in the semiconductor substrate 300 by an ion-implant method. Next, two dielectric layers 330, such as oxide layers, are formed on the souse/drain region 320. For increasing the coupling ratio of the flash memory, plurality photoresist layers 340 are defined and formed on two dielectric layers 330 and the first poly region 310. Afterward, two dielectric layers 330 are etched by means of an etched process and plurality photoresist layers 340 as etched masks, as shown in FIG. 3B. The etched process of above is an isotropic etched process that is the wet, dry or combine wet with dry method. The wet etching solution is an nitric acid ($HNO_3$)or a buffered oxide etch (BOE) solution which consists of hydrofluoric acid (HF) with an amount of the additional ammonium fluoride ($NH_4F$) to buffer the strong etching property of hydrofluoric acid (HF). Furthermore, the buffered oxide etching speed may be adjusted by adding water to the hydrofluoric acid (HF). Since the buffered oxide etch process is well known in the prior art, which are not the focus of the present invention, hence will not be described in greater details.

Figure 3C:
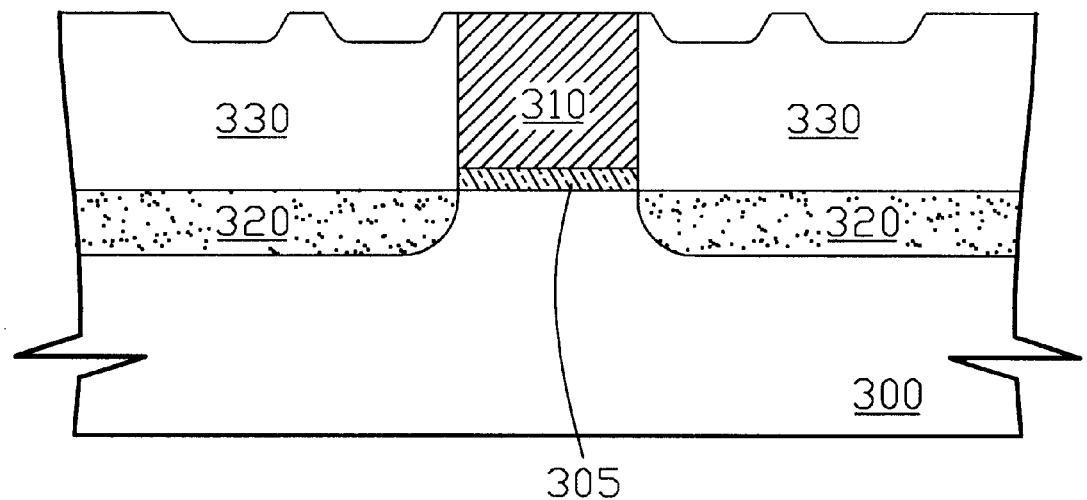
Figure 3D:
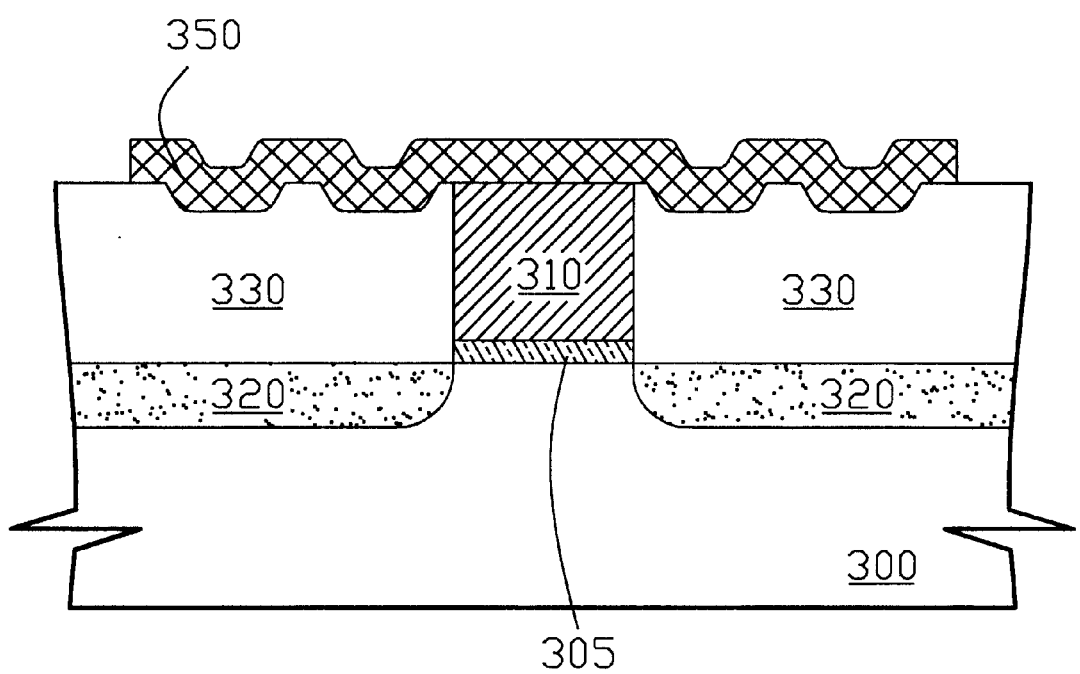

Referring to FIG. 3C, in this embodiment, there are swing-like surfaces with large surface area on two dielectric layers 330 after the etched process is finished, so as to avoid forming vertical structure of the sidewall. Plurality photoresist layers 340 are then removed. Next, a second polysilicon layer 350 is deposited along swing-like surfaces of two dielectric layers 330 and the surface of the first poly region 310 by conforming method, while the second polysilicon layer 350 is patterned to form a first gate, as shown in FIG.3D.

Figure 1A:
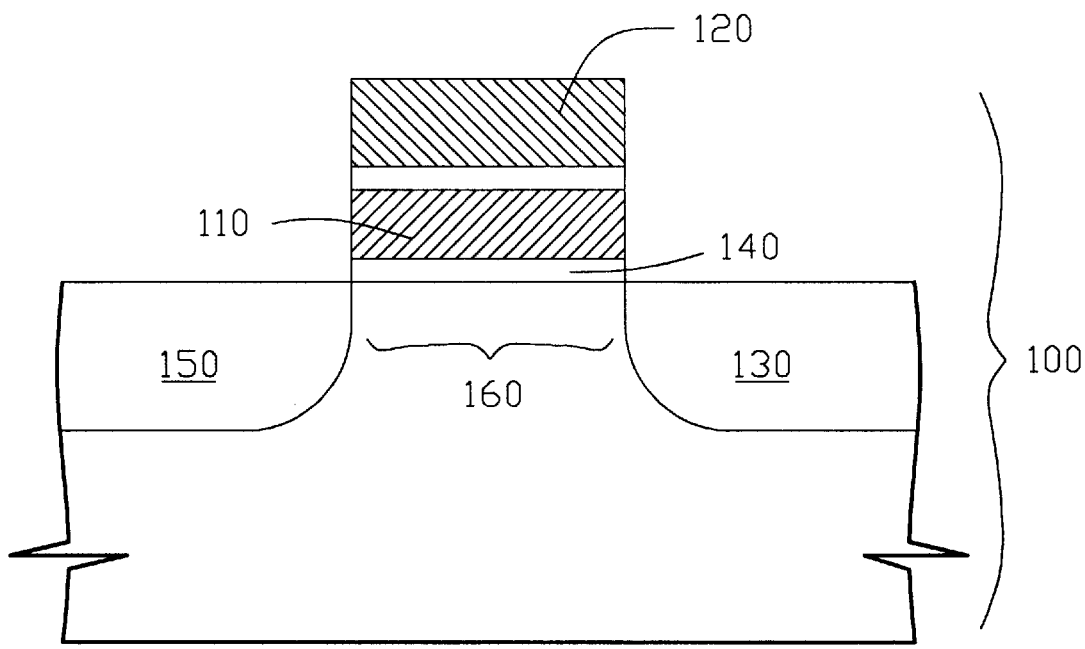
FIG. 1A shows cross-sectional views illustrative of structure in the conventional flash memory.
Figure 1B:
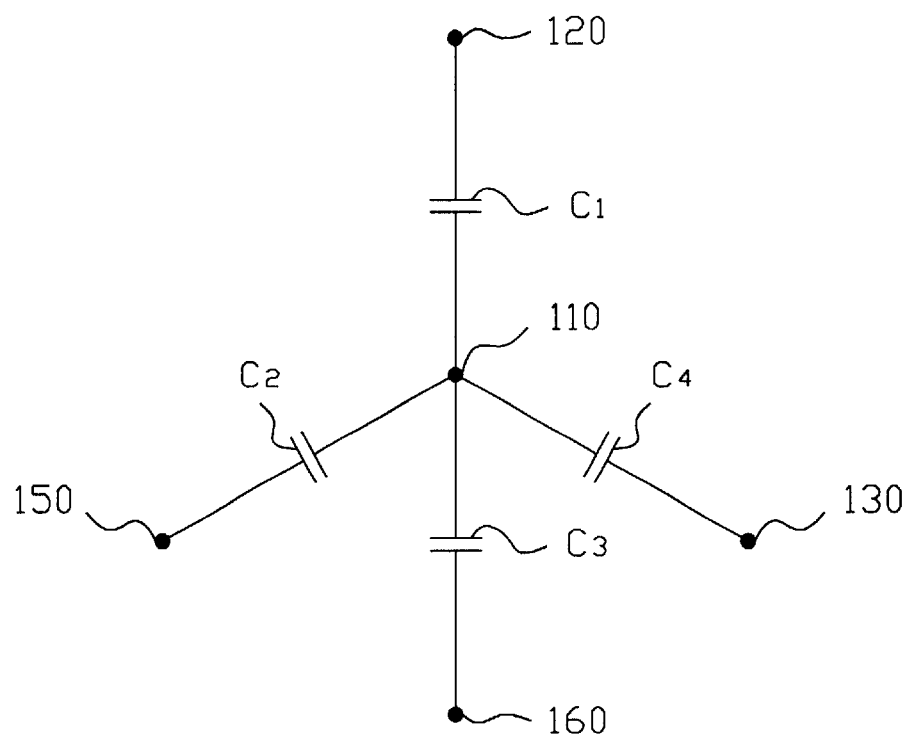
FIG. 1B shows cross-sectional views illustrative of the circuit equivalent of flash memory in FIG. 1A.
Figure 2A:
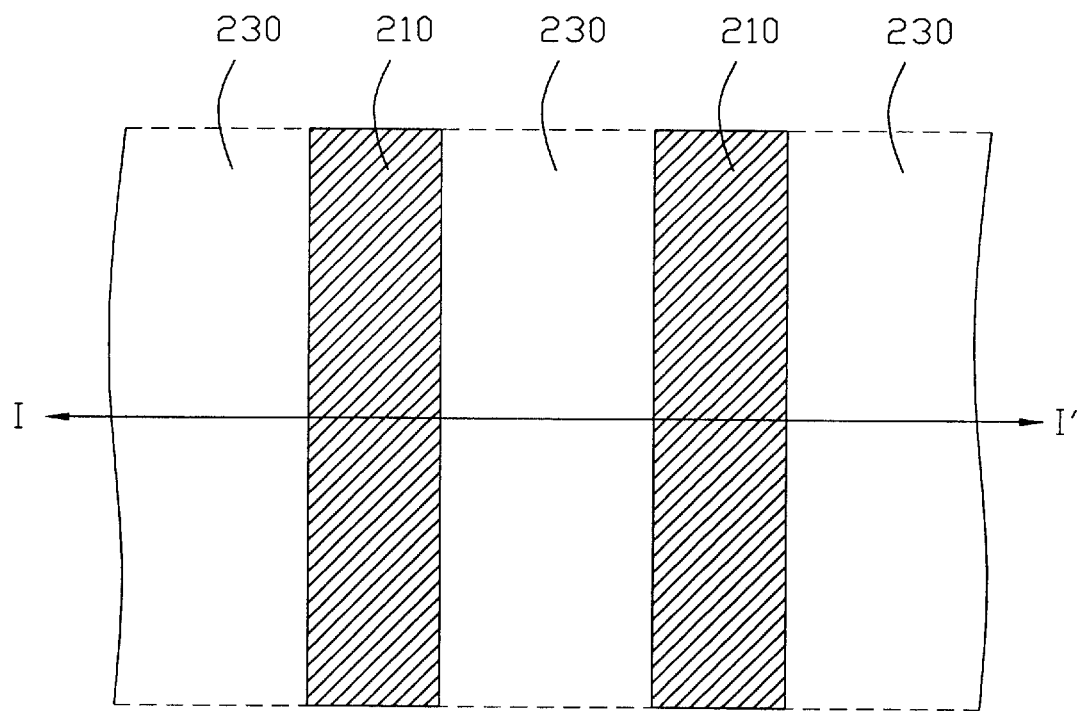
FIG. 2A shows a plan view illustrative of primary components in the conventional process of flash memory.
Figure 2B:
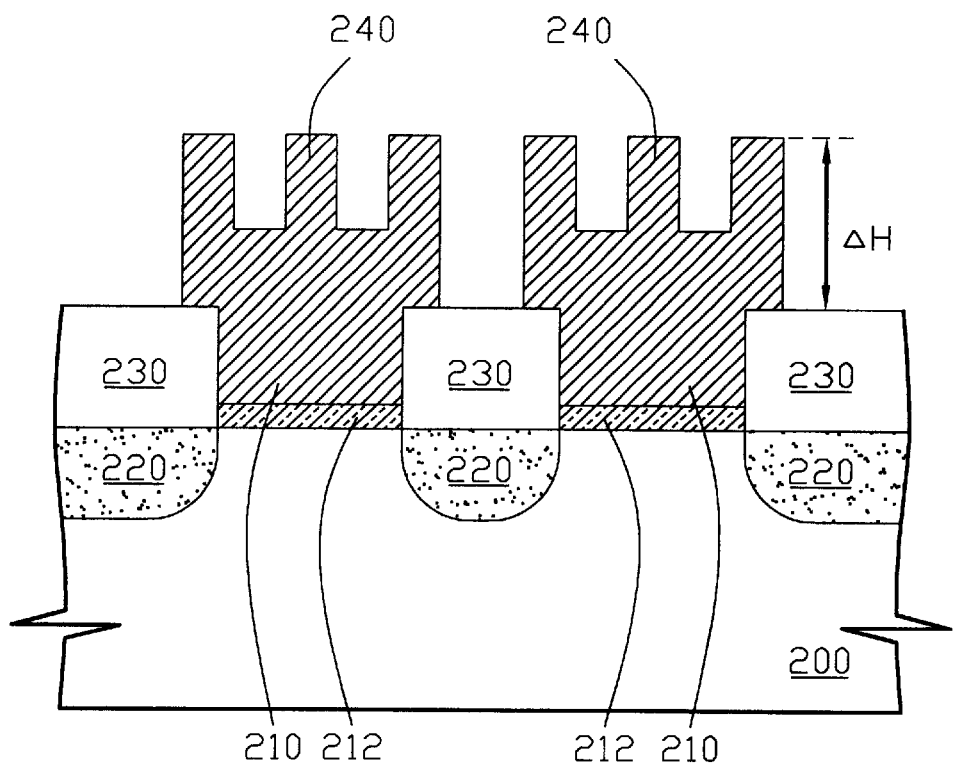
FIGS. 2B to 2C show cross-sectional views illustrative of various stages in the conventional process of flash memory, and the cross-sectional views of FIG. 2B take along line I–I' in FIG. 2A.
Figure 2C:
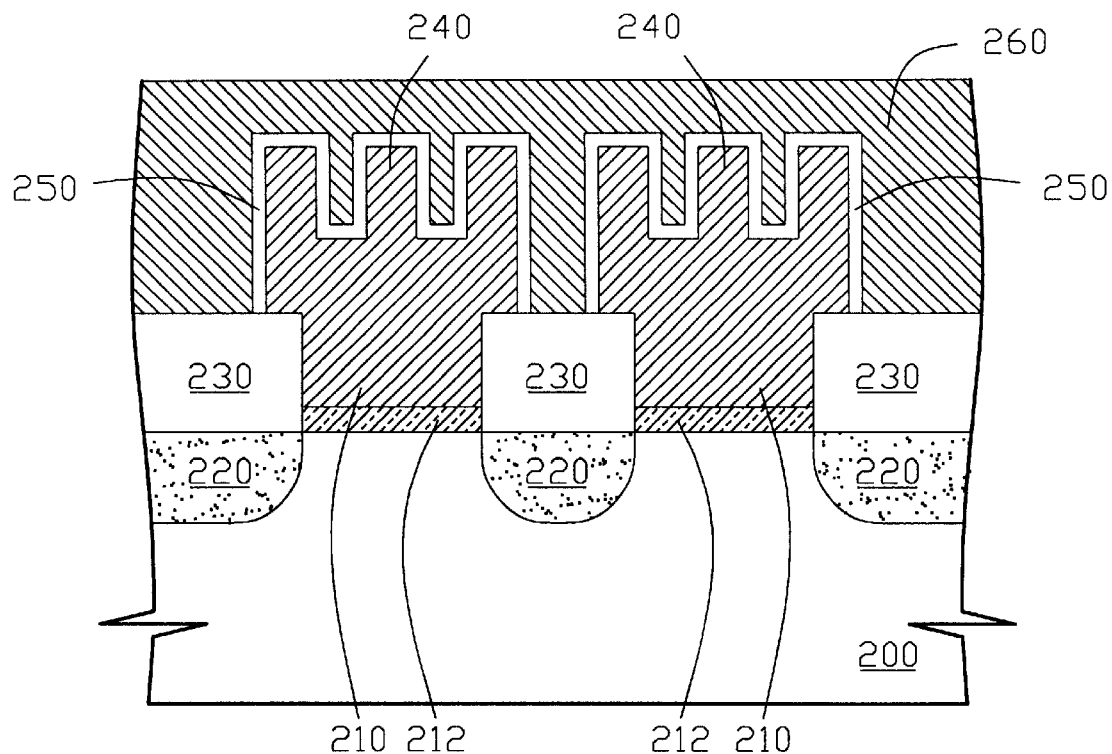
Figure 2D:
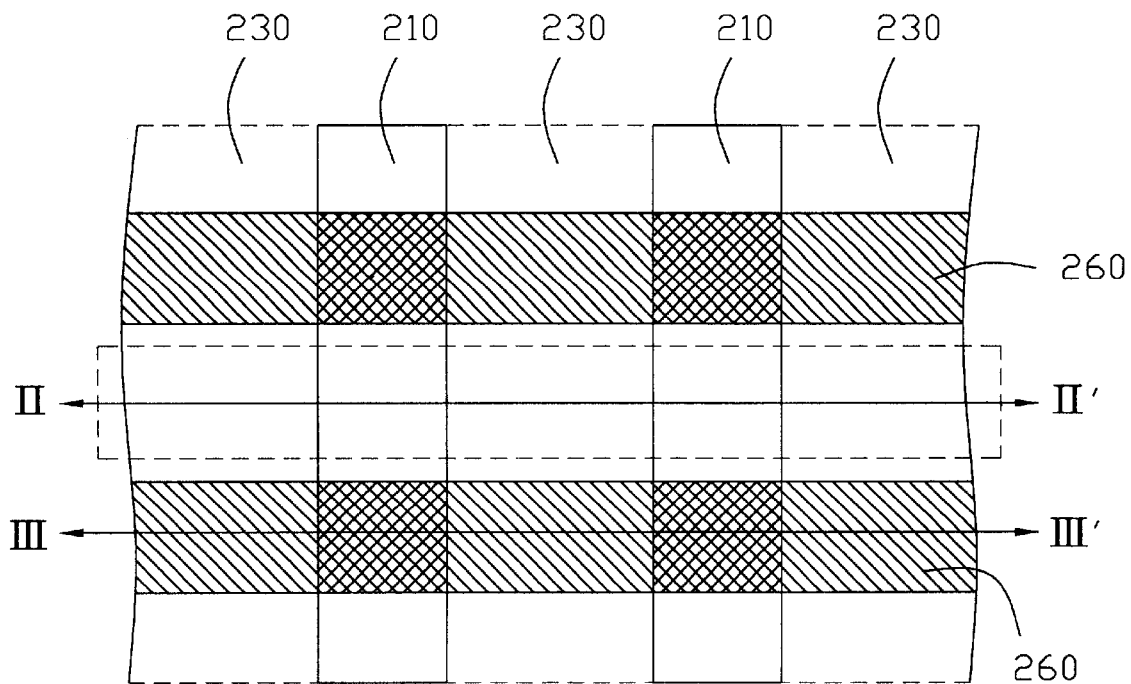
FIG. 2D shows a plan view illustrative of primary components in the conventional process of flash memory, and the cross-sectional views of FIG. 2C take along line III–III' in FIG. 2D.
Figure 2E:
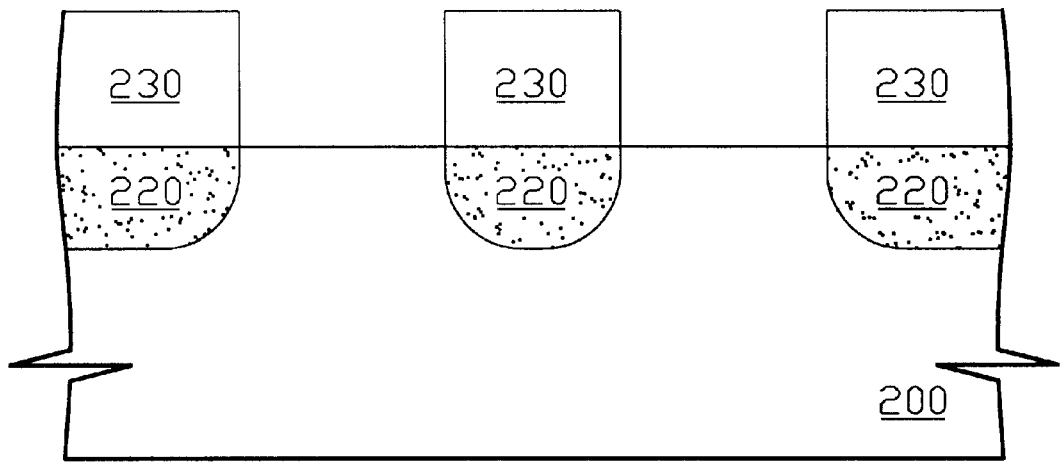
FIGS. 2E to 2G show cross-sectional views illustrative of various stages in the conventional process of flash memory, wherein the cross-sectional views of FIG. 2E and FIG. 2F take along line II–II' in FIG. 2D.
Figure 2F:
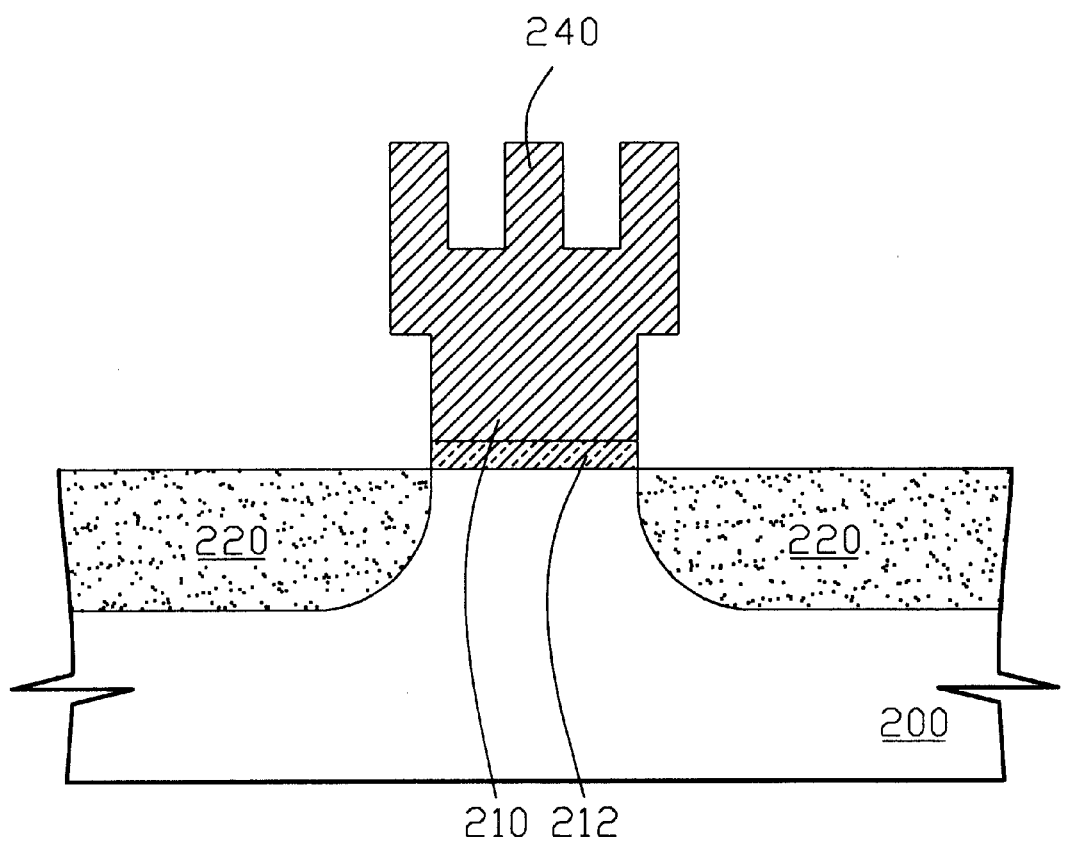
Figure 2G:
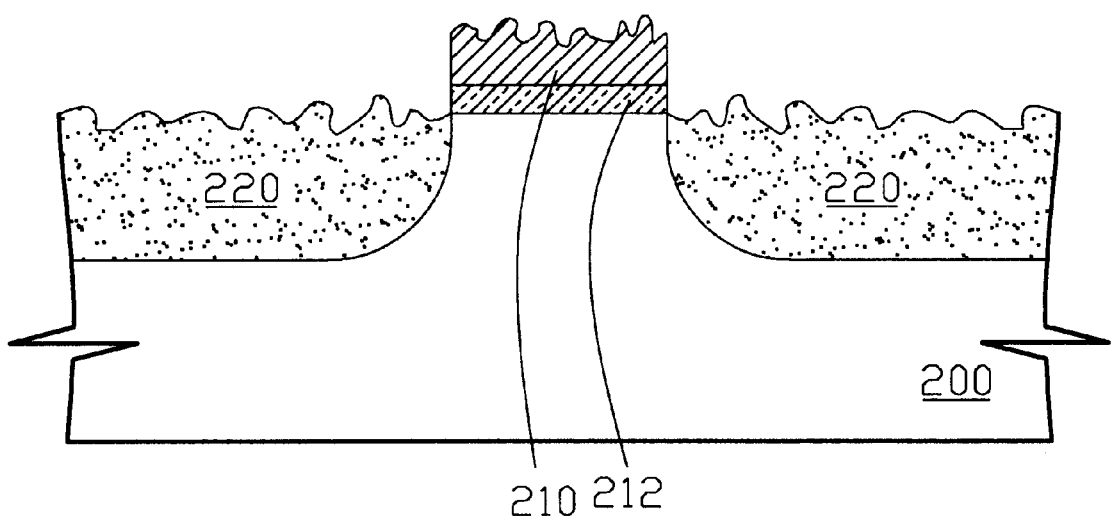
Figure 3E:
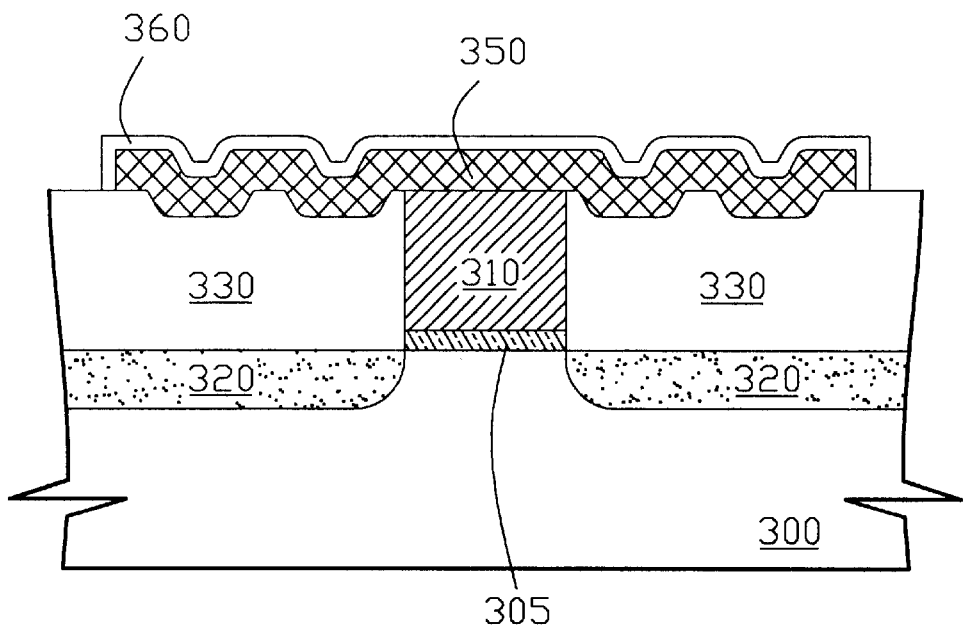
Figure 3F:
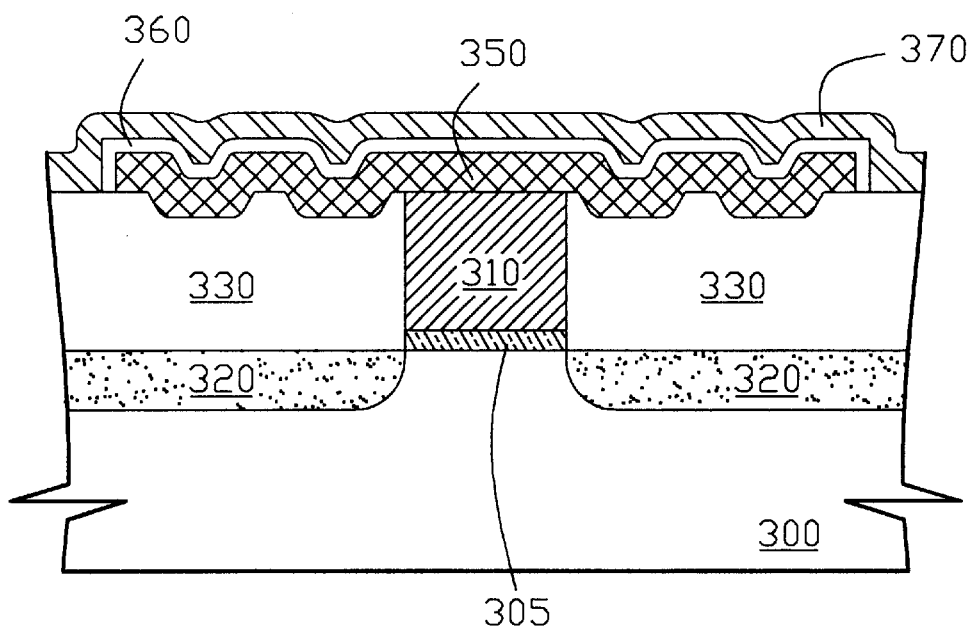

Referring to FIG. 3E, in this embodiment, an ONO layer 360 is formed along the surfaces of the second polysilicon layer 350 by conforming method. In general, an ONO layer 360 consisted of a silicon oxide film, a silicon nitride film and a silicon oxide film to be as a dielectric film. Finally, a third polysilicon layer 370 is deposited along the surfaces of two dielectric layers 330 and the surface of the ONO layer 360 by conforming method, so as to be as a second gate, as shown in FIG. 2F.

In this embodiment of the present invention, as discussed above, the surface area of the gate is increased by the swing-like structure, so as to increase the capacitance between the first gate and the second gate. Furthermore, the swing-like surface shape can avoid forming vertical structure of the sidewall to control the process window and damaging the source/drain region during the follow-up etched process. Hence, the method of the present invention can correspond to economic effect, it is also able to reach to purpose that economize on cost. Method of the present invention is the best flash memory compatible process for deep sub-micro process.

Obviously, many modifications and variations of the present invention are possible in light of the above teachings. It is therefore to be understood that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a gate of a flash memory, the method comprising:

providing a semiconductor substrate;

forming a tunnel oxide layer on said semiconductor substrate;

forming a first polysilicon layer on said tunnel oxide layer;

forming a source/drain region in said semiconductor substrate;

forming a first dielectric layer on said source/drain region;

forming plurality photoresist layers on said first dielectric layer and said first polysilicon layer;

etching first dielectric layer by said plurality photoresist layers as etched masks to form a contoured surface on said first dielectric layer;

removing said plurality photoresist layers; and conforming a second polysilicon layer along said first dielectric layer and said first polysilicon layer, so as to form said gate of said flash memory, wherein said first polysilicon layer and said second polysilicon layer are electrically connected.

2. The method according to claim 1, wherein the method for etching said first dielectric layer comprises a dry etching process.

3. The method according to claim 1, wherein the method for etching said first dielectric layer comprises a wet etching process.

4. The method according to claim 3, wherein said wet etching process comprises a buffered oxide etched solution.

5. The method according to claim 3, wherein said wet etching process comprises a nitric acid solution.

6. A method for forming a flash memory, the method comprising:

providing a semiconductor substrate having a tunnel oxide layer;

forming a first polysilicon layer on said semiconductor substrate;

forming a source/drain region in said semiconductor substrate;

forming a first dielectric layer on said source/drain region;

defining a plurality photoresist layers on said first dielectric layer and said first polysilicon layer etching first dielectric layer by said plurality of photoresist layers as etch masks to form a plurality of notches on said first dielectric layer;

removing said plurality of photoresist layers;

forming a second polysilicon layer on said first dielectric layer and said first polysilicon layer, wherein the first polysilicon layer and the second polysilicon layer are electrically connected; and forming a second dielectric layer on said second polysilicon layer to form a first gate depositing a third polysilicon layer, as a second gate, on said second dielectric to form said flash memory.

7. The method according to claim 6, wherein the method for etching said first dielectric layer comprises a dry etching process.

8. The method according to claim 6, wherein the method for etching said first dielectric layer comprises a wet etching process.

9. The method according to claim 8, wherein said wet etching process comprises a buffered oxide etched solution.

10. The method according to claim 9, wherein said buffered oxide etched solution comprises an ammonium fluoride ($NH_4F$).

11. The method according to claim 9, wherein said buffered oxide etched solution comprises a hydrofluoric acid (HF).

12. The method according to claim 8, wherein said wet etching process comprises a nitric acid solution.

13. The method according to claim 6, wherein said second polysilicon layer is formed along the surface of said first dielectric layer and said first polysilicon layer by a conformal deposition.

14. The method according to claim 6, wherein said second dielectric layer is a silicon oxide-silicon nitride-silicon oxide layer.

15. The method according to claim 6, wherein said second dielectric layer is formed along the surface of said second polysilicon layer by a conformal deposition.

16. The method according to claim 6, wherein said third poly silicon layer is formed deposition along the surfaces of said first dielectric layer and said second dielectric layer.

17. A method for forming a flash memory, the method comprising:

providing a semiconductor substrate;

forming a tunnel oxide layer on said semiconductor substrate;

forming a first polysilicon layer on said tunnel oxide layer;

forming a source/drain region in said semiconductor substrate;

forming a dielectric layer on said source/drain region;

forming plurality photoresist layers on said first dielectric layer and said first polysilicon layer;

performing a wet etched process by a buffered oxide etched solution and said plurality photoresist layers as etched masks for etching said dielectric layer to form a contoured surface on said dielectric layer;

removing said plurality photoresist layers;

conforming a second polysilicon layer along said dielectric layer and said first polysilicon layer;

conforming a oxide-nitride-oxide layer along said second polysilicon layer to form a first gate; and conforming a third polysilicon layer, as a second gate, on said oxide-nitride-oxide layer to form said flash memory.

18. The method according to claim 17, wherein said dielectric layer comprises an oxide layer.

19. The method according to claim 17, wherein said buffered oxide etched solution comprises an ammonium fluoride ($NH_4F$).

20. The method according to claim 17, wherein said buffered oxide etched solution comprises a hydrofluoric acid (HF).

* * * * *